(12) United States Patent
Teh

(10) Patent No.: US 9,990,160 B2
(45) Date of Patent: Jun. 5, 2018

(54) METHODS AND APPARATUS FOR SMART MEMORY INTERFACE

(71) Applicant: ALTERA CORPORATION, San Jose, CA (US)

(72) Inventor: Chee Hak Teh, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 25 days.

(21) Appl. No.: 15/193,686

(22) Filed: Jun. 27, 2016

(65) Prior Publication Data
US 2017/0371594 A1 Dec. 28, 2017

(51) Int. Cl.
*G06F 3/06* (2006.01)
*G06F 11/10* (2006.01)
*G11C 29/52* (2006.01)

(52) U.S. Cl.
CPC .......... *G06F 3/0664* (2013.01); *G06F 3/0604* (2013.01); *G06F 3/0619* (2013.01); *G06F 3/0632* (2013.01); *G06F 3/0683* (2013.01); *G06F 11/1068* (2013.01); *G11C 29/52* (2013.01)

(58) Field of Classification Search
CPC ........................................... G06F 11/01–11/76
USPC .............................. 714/764, 770, 718, 45, 28
See application file for complete search history.

(56) References Cited

U.S. PATENT DOCUMENTS

| | | | | |
|---|---|---|---|---|
| 4,920,483 | A * | 4/1990 | Pogue | G06F 12/0207 711/219 |
| 6,173,425 | B1 * | 1/2001 | Knaack | G11C 29/003 714/718 |
| 7,660,316 | B2 * | 2/2010 | Warren | H04L 12/433 370/223 |
| 8,370,557 | B2 | 2/2013 | Dama et al. | |
| 8,374,050 | B2 * | 2/2013 | Zhou | G11C 8/16 365/230.03 |
| 2004/0076147 | A1 * | 4/2004 | Loge | H04L 12/5601 370/386 |
| 2006/0184846 | A1 | 8/2006 | Hillier et al. | |
| 2006/0221945 | A1 | 10/2006 | Chin et al. | |
| 2010/0205383 | A1 | 8/2010 | Blackmon et al. | |
| 2014/0307739 | A1 | 10/2014 | Aybay | |
| 2016/0098061 | A1 | 4/2016 | Teh | |

* cited by examiner

*Primary Examiner* — Fritz Alphonse
(74) *Attorney, Agent, or Firm* — Compass IP Law PC

(57) ABSTRACT

One embodiment relates to a memory structure that includes a bank group and a port emulation circuit module. The bank group includes a plurality of memory banks, each memory bank having one read port and one write port. The port emulation circuit module provides a group read/write port and a group read port for the bank group. Another embodiment relates to a port emulation circuit module. The port emulation circuit module includes a port emulation control circuit that receives control signals including a first address for a group read/write port and a second address for a group read port, a first data path circuit for the group read/write port, and a second data path circuit for the group read port, wherein the second data path circuit outputs a second read data. Other embodiments and features are also disclosed.

19 Claims, 9 Drawing Sheets

METHODS AND APPARATUS FOR SMART MEMORY INTERFACE

BACKGROUND

Technical Field

The present disclosure relates generally to the technology area of interface architectures for communicating with memory devices.

Description of the Background Art

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line, which is used for storing a bit into the SRAM cell or read from the SRAM cell.

SUMMARY

One embodiment relates to a memory structure that includes a bank group and a port emulation circuit module. The bank group includes a plurality of memory banks, each memory bank having one read port and one write port. The port emulation circuit module provides a group read/write port and a group read port for the bank group.

Another embodiment relates to a port emulation circuit module. The port emulation circuit module includes a port emulation control circuit that receives control signals including a first address for a group read/write port and a second address for a group read port, a first data path circuit for the group read/write port, and a second data path circuit for the group read port, wherein the second data path circuit outputs a second read data.

Another embodiment relates to a method of reading data from a memory bank group. A data read requesting data at a read address in a specified memory bank is received from a read/write port of the memory bank group. A determination is made that the specified memory bank has a conflicting data read from a read port of the memory bank group. Data is read from the read address in all other memory banks in the memory bank group. The data at the read address in the specified memory bank is reconstructed using the data read from the read address in all the other memory banks.

Another embodiment relates to a method of writing data to a memory bank group. A data write is received that requests new data be written to a write address in a specified memory bank of the memory bank group. Previous data at the write address in the specified memory bank is read. An updated parity is calculated, and the updated parity is written to the write address in a parity memory bank of the memory bank group. The new data is written to the write address in the specified memory bank.

Other embodiments and features are also disclosed.

DETAILED DESCRIPTION

The present disclosure provides circuit structures and method of operation for a smart memory interface. The smart memory interface is capable of executing smart memory functions and may provide an emulated 1R+1RW (one read port and one read/write port) SRAM channel from a collection of 1R+1W (one read port and one write port) SRAM banks without memory access restrictions. The smart memory interface may also be configured so that the collection of 1R+1W SRAM banks operates as a large 1R+1W SRAM if the emulated 1R+1RW SRAM channel is not desired. The configuration implemented may depend on the application mapped to the core logic of the integrated circuit.

The "smartness" is provided via atomic operation functionalities to the 1RW port. The atomic operation functionalities allow for applications to perform smart memory operations on the SRAM memory itself without affecting the raw memory bandwidth and with low power.

The smart memory interface may advantageously reduce application power and transaction bandwidth required for common read-modify-write operations. This is accomplished by removing the need to physically transfer the read data from the SRAM back to the core logic of the integrated circuit (such as, for example, the core fabric of a field programmable gate array) for modifications and transferring the write data back to be written to the same SRAM location.

The smart memory interface may also advantageously allow the swapping of temporal data storage contents for store-and-forward memory applications. This reduces memory capacity, power and bandwidth requirements for the applications.

Figure 1:
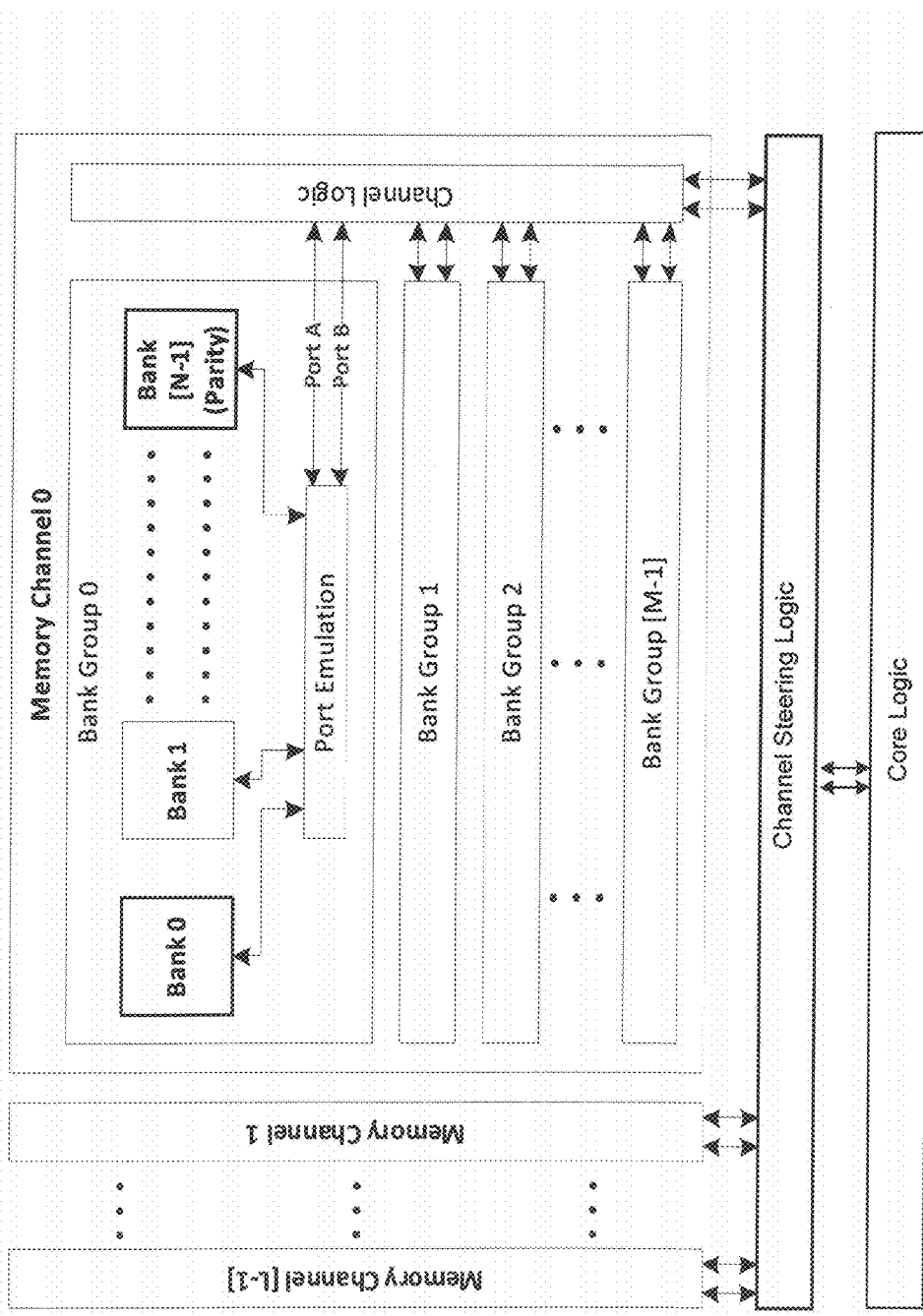
FIG. 1 depicts an exemplary memory architecture organized into multiple memory channels, each memory channel including multiple bank groups, and each bank group including multiple SRAM banks in accordance with an embodiment of the invention.

FIG. 1 depicts an exemplary memory architecture organized into multiple memory channels, each memory channel including multiple bank groups, and each bank group including multiple SRAM banks in accordance with an embodiment of the invention. As depicted, channel steering logic may be used to interface with L memory channels (Memory Channel 0, Memory Channel 1, Memory Channel 2, . . . , Memory Channel L-2, and Memory Channel L-1), and the channel steering logic may interface with the core logic of the integrated circuit (such as the programmable fabric of an FPGA).

The channel steering logic operates to steer the accesses (read/write command and read/write data) to and from the respective memory channels from multiple inputs from the core logic. There may be multiple memory channel access ports from the core logic, and, in that case, the channel steering logic steers access from a particular access port to a correct memory channel. In some embodiments, the channel steering logic can be replaced with a UIB-lite (which is a simplified version of the Universal Interface Bus).

An expanded view is shown for the internal structure of Memory Channel 0, and the same internal structure would also be present in the other L-1 memory channels. As shown, each memory channel includes M bank groups (Bank Group 0, Bank Group 1, Bank Group 2, . . . , Bank Group M-2, and Bank Group M-1).

Figure 2:
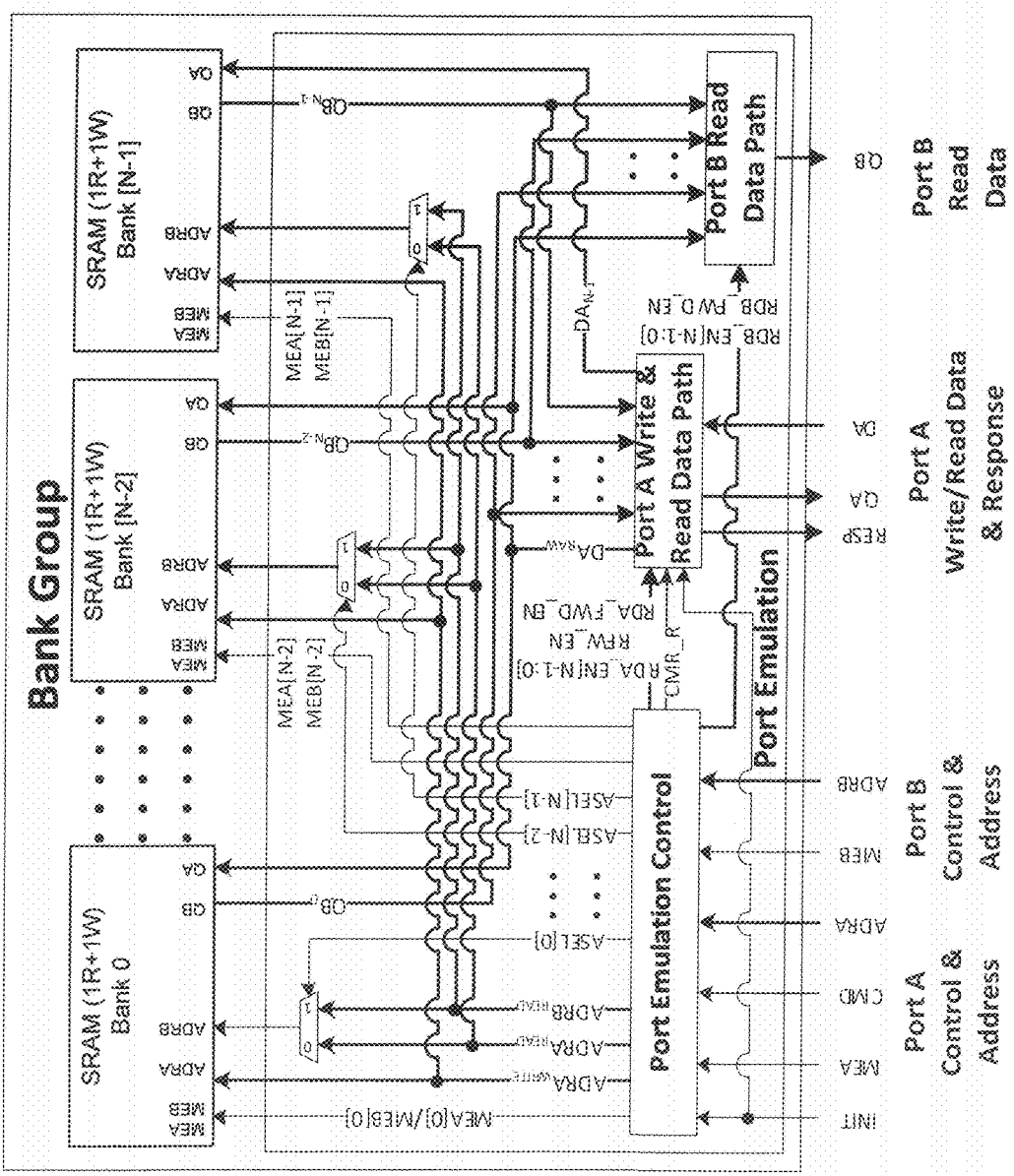
FIG. 2 depicts further detail of an exemplary bank group in accordance with an embodiment of the invention.

An expanded view is shown for the internal structure of Bank Group 0, and the same internal structure would also be present in the other M-1 bank groups. As shown, each bank group includes N SRAM banks (Bank 0, Bank 1, Bank 2, . . . , Bank N-2, and Bank N-1), a Port emulation circuit module, and Channel Logic. As indicated, Bank N-1 may be a parity bank in an exemplary implementation of the bank group. Each bank group uses the channel logic to interface with the channel steering logic. The channel logic uses decodes the read/write commands to the respective bank groups and uses Port A and Port B, as provided by the port emulation circuit module, to interface with each bank group in the memory channel. Port A is a group read/write port, and Port B is a group read port. FIG. 2 depicts further detail of an exemplary bank group in accordance with an embodiment of the invention. As depicted, the bank group may be formed using a number N of 1R+1W SRAM banks (Bank 0, Bank 1, . . . , Bank N-2, Bank N-1) and a Port emulation circuit module.

One of the 1R+1W SRAM banks in the bank group is a parity bank. In an exemplary implementation, Bank N-1 is the parity bank. Each 1R+1W SRAM bank has one read port (B) and one write port (A). More particularly, each SRAM bank n has control (MEA/MEB) port, address A (ADRA) port, address B (ADRB) port, data read (QB) port, and data write (QA) port.

The Port emulation circuit module includes a Port Emulation Control circuit, Port A Write & Read Data Path circuit, and Port B Read Data Path circuit.

The Port Emulation Control circuit has initialization (INIT) and request command (CMD) control signal inputs, Port A Control and Address (MEA and ADRA) inputs, Port B Control and Address (MEB and ADRB) inputs. The Port Emulation Control circuit uses these inputs to generate various control and address signals.

Note that the term "atomic" operation may refer to an operation that is performed in parallel or concurrently with other operations to the same memory locations. Many systems avoid requests for atomic operations due to the possible creation of erroneous data.

In an exemplary implementation, the request command (CMD) of the 1RW port (Port A) includes encodings for desired atomic operations that are mapped to either read accesses (for operations requiring only memory reads) or write accesses (for operations requiring read-modify-write sequences). Example encodings include: binary addition; Boolean operations (AND, NAND, NOR, OR, XOR); data swap; and arithmetic compare (equal, greater than, less than).

The Port Emulation Control circuit generates N MEA/MEB control signals (MEA[0]/MEB[0], MEA[1]/MEB[1], MEA[2]/MEB[2], . . . , MEA[N-1]/MEB[N-2], MEA[N-1]/MEB[N-1]). The MEA[0]/MEB[0] control is provided to SRAM Bank 0. The MEA[1]/MEB[1] control is provided to SRAM Bank 1. The MEA[2]/MEB[2] control is provided to SRAM Bank 2. And so on.

The Port Emulation Control circuit also generates Write Address A ($ADRA_{WRITE}$), Read Address A ($ADRA_{READ}$), and Read Address B ($ADRB_{READ}$), and N selection (ASEL [0], ASEL[1], . . . , ASEL[N-2], ASEL[N-1]) signals. The $ADRA_{READ}$ and $ADRB_{READ}$ signals provided as inputs to N selectors (S[0], S[1], . . . , S[N-2], S[N-1]). Selector S[0] is controlled by ASEL[0]. Selector S[1] is controlled by ASEL [1]. Selector S[2] is controlled by ASEL[2]. And so on. When ASEL[n] is 0, then selector S[n] outputs $ADRA_{READ}$ to the ADRB input of SRAM Bank n. On the other hand, when ASEL[n] is 1, then selector S[n] outputs $ADRB_{READ}$ to the ADRB input of SRAM Bank n.

The Port A Write & Read Data Path circuit receives the N read data outputs ($QB_0$, $QB_1$, . . . , $QB_{N-2}$, $QB_{N-1}$) from the N SRAM banks and the data write (DA) signal from the channel logic. The Port A Write & Read Data Path circuit also receives the CMR_R, RDA_EN[N-1:0], RFW_EN, and RDA_FWD_EN control signals from the Port Emulation Control circuit. Note that the CMR_R control signal conveys regular and atomic commands based on request command encodings.

Using the various input signals, the Port A Write & Read Data Path circuit generates a first data write ($DA_{RAW}$) signal and a second data write signal ($DA_{N-1}$). The first data write ($DA_{RAW}$) signal is output to the QA ports of SRAM banks 0 to N-2 and to the Port B Read Data Path circuit, and the second data write signal ($DA_{N-1}$) is output to the QA port of SRAM bank N-1. The Port A Write & Read Data Path circuit also generates the response interface (RESP) signal and the data read (QA) signal that are output to the channel logic.

Note that, in an exemplary implementation, the Port A Write & Read Data Path circuit includes hardware circuits for desired atomic operations between the read and the write data for the parity calculations of the write sequence. For operations taking multiple pipelined stages, hardware circuits may be pipelined as needed for timing closure.

Note further that, in an exemplary implementation, the response interface (RESP) signal output from the Port A Write & Read Data Path circuit may convey results of atomic operations to the channel logic. For example, the RESP signal may provide the result of an arithmetic compare operation (i.e. equal, greater than, or less than).

The Port B Read Data Path circuit receives the N data read signals ($QB_0$, $QB_1$, . . . , $QB_{N-2}$, $QB_{N-1}$) from the data read (QB) ports of the N SRAM banks. The Port B Read Data Path circuit also receives the first data write ($DA_{RAW}$) signal from the Port A Write & Read Data Path circuit. Using the various input signals, the Port B Read Data Path circuit selects the data read (QB) signal to the channel logic.

Figure 3:
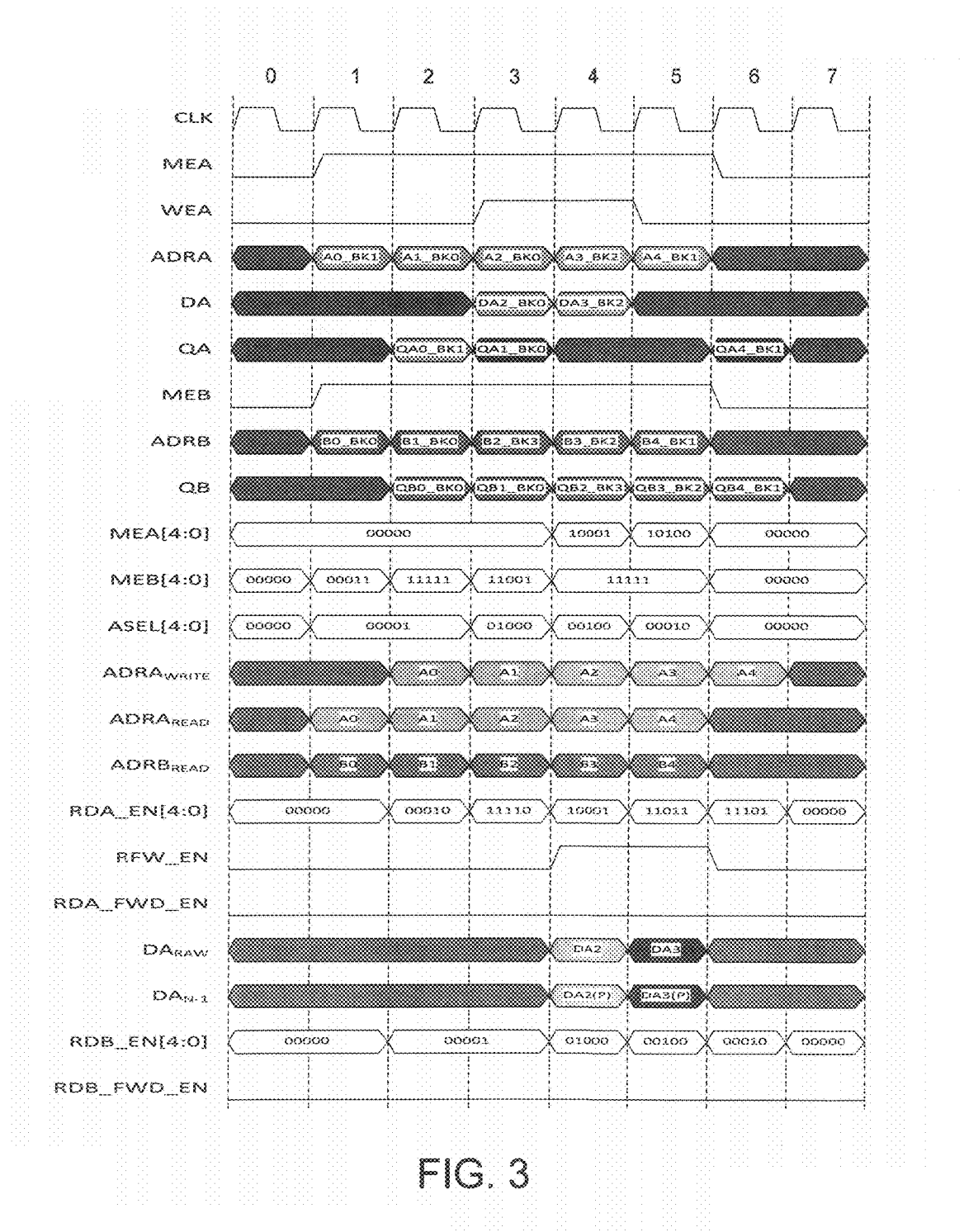
FIG. 3 is an exemplary timing diagram for the signals of the bank group depicted in FIG. 2 in accordance with an embodiment of the invention.

FIG. 3 is an exemplary timing diagram for the signals of the bank group depicted in FIG. 2 in accordance with an embodiment of the invention. The timing diagram assumes that N=5, such that there are five SRAM banks in the bank group.

The CLK signal shows clock cycles labeled 0 to 7. The signals between the bank group and the channel logic include the MEA, WEA, ADRA, DA, QA, MEB, ADRB and QB signals. The signals internal to the bank group include the MEA[4:0], MEB[4:0], ASEL[4:0], $ADRA_{WRITE}$, ADRA$_{READ}$, ADRB$_{READ}$, RDA_EN[4:0], RFW_EN, RDA_FWD_EN, DA$_{RAW}$, DA$_{N-1}$, RDB_EN[4:0], and RDB_FWD_EN signals.

In the example shown, at clock cycle 1, the MEA and MEB signals transition to logical 1, the write enable for Port A (WEA) signal is logical zero (indicating a read operation), read address A0_BK1 (indicating address A0 in bank 1) is received on ADRA, and read address B0_BK0 (indicating address B0 in bank 0) is received on ADRB. At clock cycle 2, in fulfillment of the read requests of the previous clock cycle, the data read QA signal outputs data QA0_BK1 (indicating the data read from address A0 in bank 1), and the data read QB signal outputs data QB0_BK0 (indicating the data read from address B0 in bank 0).

Similarly, at clock cycle 2, read address A1_BK0 (indicating address A1 in bank 0) is received on ADRA, and read address B1_BK0 (indicating address B1 in bank 0) is received on ADRB. At clock cycle 3, in fulfillment of the read requests of the previous clock cycle, the data read QA signal outputs data QA1_BK0 (indicating the data read from address A1 in bank 0). In addition, due to ASEL[4:0] being set to logical one, the data read QB signal outputs data QB1_BK0 (indicating the data read from address B1 in bank 0).

Note that data QA1_BK0 output in clock cycle 3 cannot be directly read from bank 0. This is because there is an access conflict at bank 0 due to both read addresses being in bank 0. Hence, in accordance with an embodiment of the present disclosure, the data QA1_BK0 is reconstructed using the method 600 described below in relation to FIG. 6. In this case, the reconstruction requires data from banks 1 to 4 (but not bank 0), so RDA_EN[4:0]=11110 in clock cycle 3.

At clock cycle 3, the write enable for port A (WEA) goes to logical one to indicate a write operation, write data DA2_BK0 is received on the DA port, write address A2_BK0 (indicating address A2 in bank 0) is received on ADRA, and read address B2_BK3 (indicating address B2 in bank 3) is received on ADRB. At clock cycle 4, as a consequence of the write command on port A in the previous cycle, the previous data of the targeted entry is read directly from address A2 in bank 0, and the clock parity for address A2 in bank 4 is updated (so RDA_EN[4:0]=10001, ADA$_{WRITE}$=A2, and DA$_{N-1}$=DA$_4$=DA2(P) in clock cycle 4). In addition, in fulfillment of the read command on port B in the previous clock cycle, the data read QB signal outputs data QB2_BK3 (indicating the data read from address B2 in bank 3).

At clock cycle 4, write data DA3_BK2 is received on the DA port, write address A3_BK2 (indicating address A3 in bank 2) is received on ADRA, and read address B3_BK2 (indicating address B3 in bank 2) is received on ADRB. At clock cycle 5, as a consequence of the write command on port A in the previous cycle, the previous data of the targeted entry is reconstructed (due to the read conflict at bank 2) for address A3 in bank 2, and the clock parity for address A3 in bank 4 is updated (so RDA_EN[4:0]=11011, ADA$_{WRITE}$=A3, and DA$_{N-1}$=DA$_4$=DA3(P) in clock cycle 5). In addition, in fulfillment of the read request of the previous clock cycle, the data read QB signal outputs data QB3_BK2 (indicating the data read from address B3 in bank 2).

At clock cycle 5, the write enable for port A (WEA) goes to logical zero to indicate a read operation, read address A4_BK1 (indicating address A4 in bank 1) is received on ADRA, and read address B4_BK1 (indicating address B4 in bank 1) is received on ADRB. At clock cycle 6, in fulfillment of the read requests of the previous clock cycle, the data read QA signal outputs data QA4_BK1 (indicating the data read from address A4 in bank 1), and the data read QB signal outputs data QB4_BK1 (indicating the data read from address B4 in bank 1).

Note that data QA4_BK1 output in clock cycle 6 cannot be directly read from bank 1. This is because there is an access conflict at bank 1 due to both read addresses being in bank 1. Hence, in accordance with an embodiment of the present disclosure, the data QA4_BK1 is reconstructed using the method 600 described below in relation to FIG. 6. In this case, the reconstruction requires data from banks 0, 2, 3 and 4 (but not bank 1), so RDA_EN[4:0]=11101 in clock cycle 6.

Also the MEA and MEB signals go to logical zero at clock cycle 6. As such, no read or write requests are received during that clock cycle.

Figure 4:
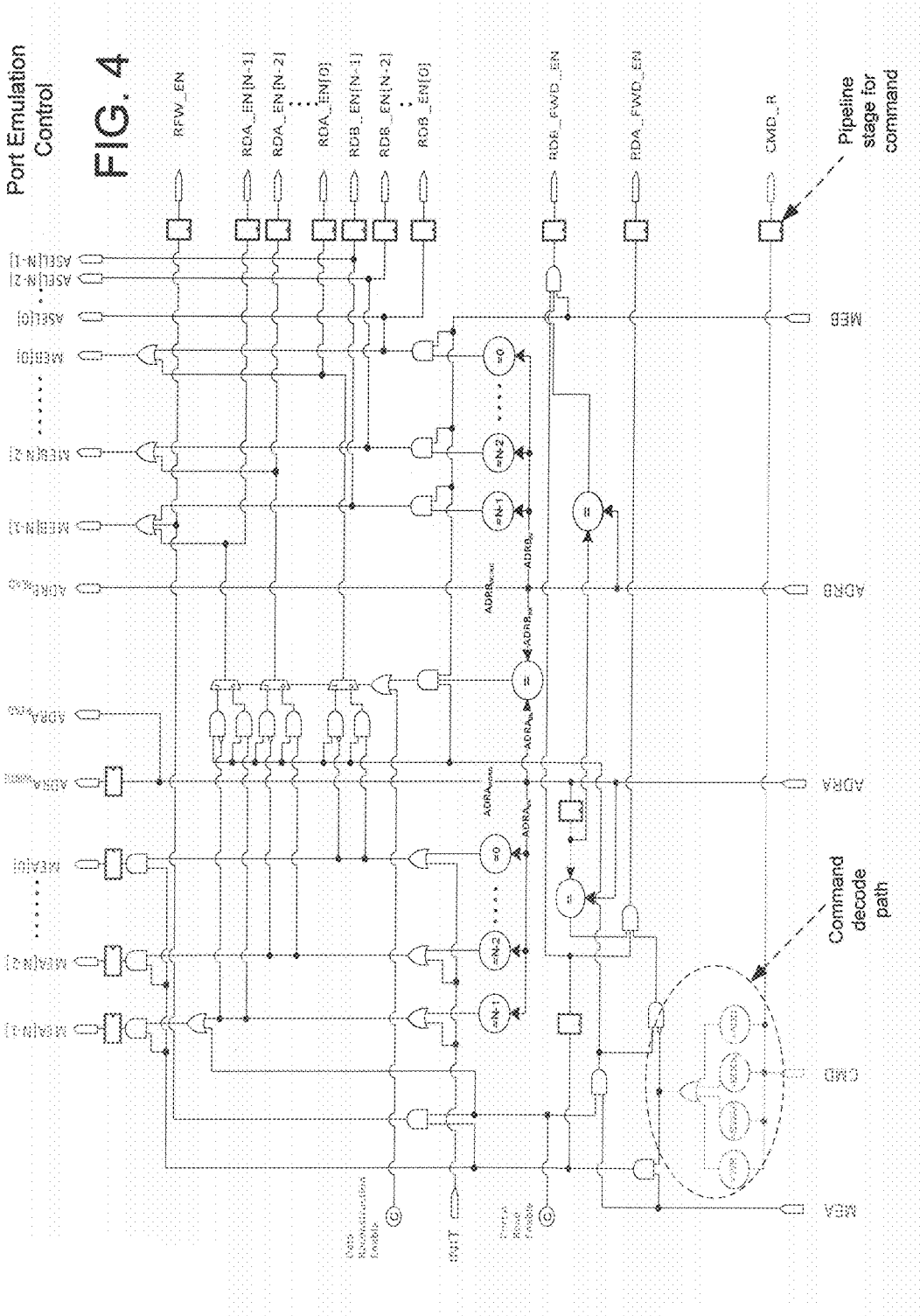
FIG. 4 depicts detail of an exemplary port emulation control circuit in accordance with an embodiment of the invention.

FIG. 4 depicts detail of an exemplary port emulation control circuit in accordance with an embodiment of the invention. As depicted, the Port Emulation Control circuit has initialization (INIT) and command (CMD) inputs, Port A Control and Address (MEA and ADRA) inputs, Port B Control and Address (MEB and ADRB) inputs.

The INIT input is used to initialize the SRAM array with known content (for example, all zeroes). When INIT is asserted, the user logic cycles through all the address bits from port A to write all the contents in all the banks to zeroes. In an exemplary implementation, such initialization to all zeroes is required before using the smart memory.

The Port Emulation Control circuit generates various control and address signals. In particular, the Port Emulation Control circuit generates N MEA/MEB control signals (MEA[0]/MEB[0], MEA[1]/MEB[1], MEA[2]/MEB[2], MEA[N-1]/MEB[N-2], MEA[N-1]/MEB[N-1]). The Port Emulation Control circuit also generates Write Address A (ADRA$_{WRITE}$), Read Address A (ADRA$_{READ}$), and Read Address B (ADRB$_{READ}$), and N selection (ASEL[0], ASEL[1], ..., ASEL[N-2], ASEL[N-1]) signals. Finally, the Port Emulation Control circuit generates the control CMR_R, RDA_EN[N-1:0], RFW_EN, and RDA_FWD_EN control signals.

Two configuration bits are shown for the Port Emulation Control circuit. A first configuration bit is the Data Reconstruction Enable bit. When the Data Reconstruction Enable bit is logical one, then read reconstruction is enabled. When the Data Reconstruction Enable bit is logical zero, then read reconstruction is disabled. In an exemplary implementation, the Data Reconstruction Enable allows reconstruction of the contents of an entire bank by reusing the same port emulation mechanism. For example, if multiple bits in bank 0 are corrupted due to a single event upset (SEU) or other errors, then the user logic may enable data reconstruction and do a read and write back to the bank 0 from port A. This causes the data to be reconstructed from banks 1, 2, ..., N-1 (not read from bank 0) and then written back to bank 0. This corrects the errors in bank 0.

A second configuration bit is the Port A Read Enable bit. When the Port A Read Enable bit is logical one, then the Port A read operation is enabled. When the Port A Read Enable bit is logical zero, then the Port A read operation is disabled.

Note that, as shown in FIG. 4, the Port Emulation Control circuit includes a command decode path. The command decode path operates to decode atomic operations. In addition, a pipelined command (CMD_R) is provided to the Port A Write & Read Data Path circuit. The pipelined command may be used to identify the atomic operation to be performed by the Port A Write & Read Data Path circuit on one or more operands. In particular, the operands may include Operand 1 that may be obtained, or reconstructed from, $QB_0$ to $QB_{N-1}$ and optional Operand 2 that may be provided by DA.

Figure 5:
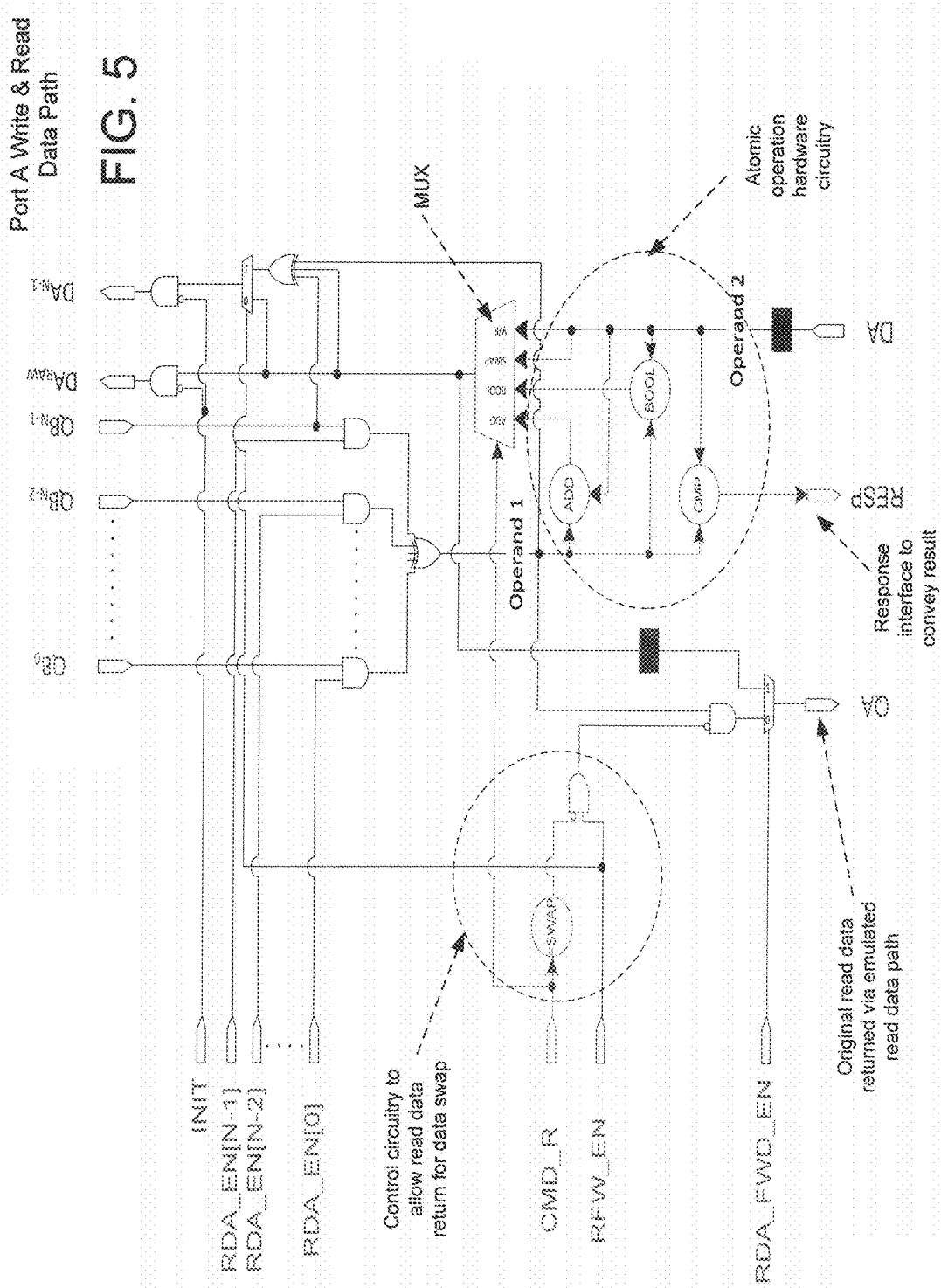
FIG. 5 depicts detail of a port A write and read data path circuit in accordance with an embodiment of the invention.

FIG. 5 depicts detail of a port A write and read data path circuit in accordance with an embodiment of the invention. As shown, the Port A Write & Read Data Path circuit receives the N read data outputs ($QB_0$, $QB_1$, ..., $QB_{N-2}$, $QB_{N-1}$) from the N SRAM banks and the data write (DA) signal from the channel logic. The Port A Write & Read Data Path circuit also receives the CMR_R, RDA_EN[N-1:0], RFW_EN, and RDA_FWD_EN control signals from the Port Emulation Control circuit.

Using the various input signals, the Port A Write & Read Data Path circuit generates a first data write ($DA_{RAW}$) signal and a second data write signal ($DA_{N-1}$). The Port A Write & Read Data Path circuit also generates the response (RESP) signal and the data read (QA) signal that are output to the channel logic.

As shown in FIG. 5, atomic operation hardware circuitry may be included in the port A write and read data path circuit. The atomic operation hardware circuitry may include binary adder logic (ADD), Boolean operation logic (BOOL) (such as AND, NAND, OR, NOR, and XOR logic), and compare logic (CMP). In addition, control circuitry may be included to allow read data return for a data swap operation (SWAP). A multiplexer (MUX) may be used to select the write data to be written back (modified or raw write data) and used for a final parity calculation. The original read data may be returned via the emulated read data path (QA), and the Response interface (RESP) may be used to convey the result of the arithmetic compare operation performed by the compare logic (CMP).

Figure 6:
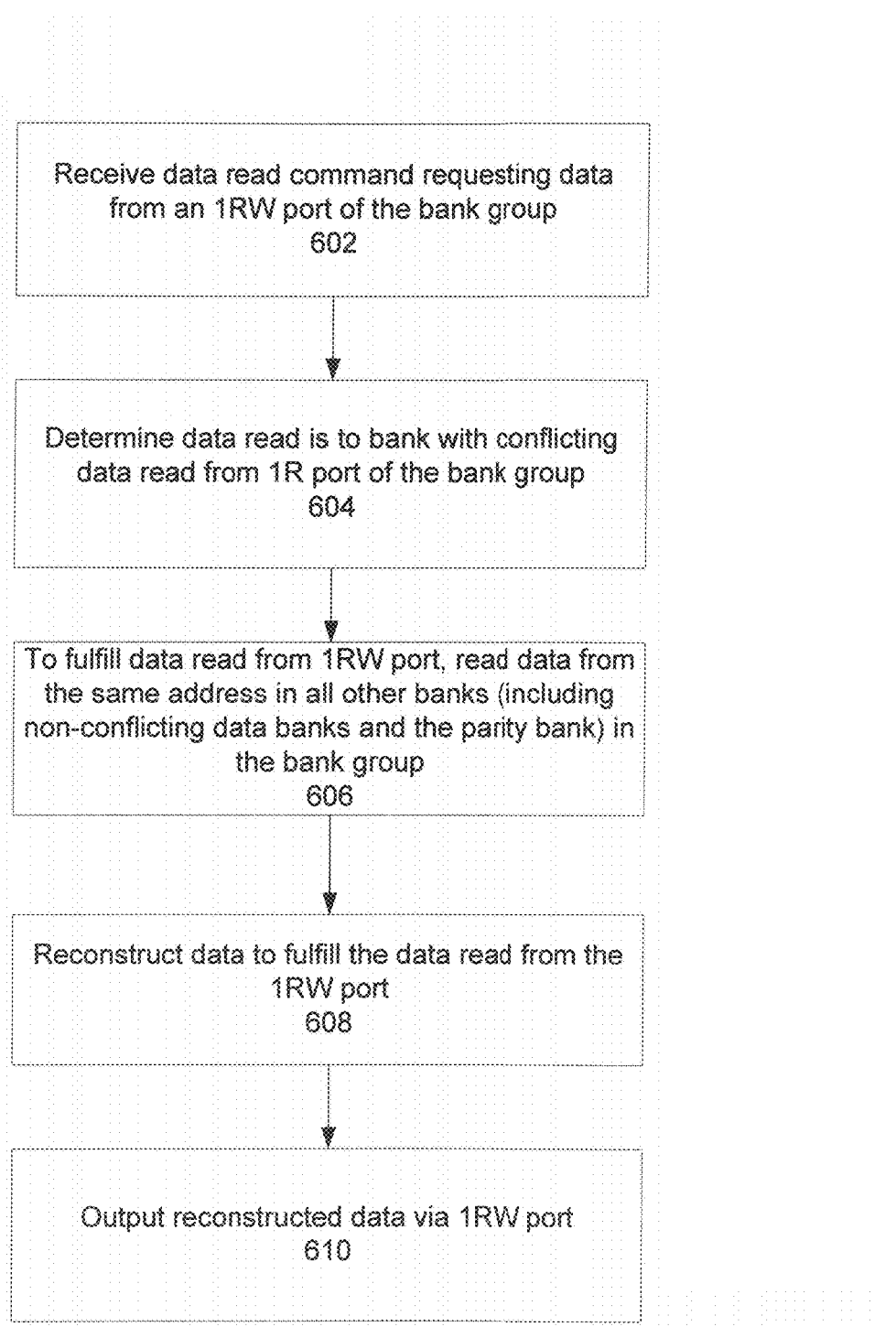
FIG. 6 is a flow chart of a method for a data read of an entry within a conflicting bank from the emulated 1RW port in accordance with an embodiment of the invention.

FIG. 6 is a flow chart of a method 600 for a data read of an entry within a conflicting bank from the 1RW port of a bank group in accordance with an embodiment of the invention. The method 600 may be implemented using the exemplary circuits described above in relation to FIGS. 1-5.

Per step 602, a data read command is received from the 1RW port of the bank group. In the exemplary circuits described above, Port A is the 1RW port of the bank group, and the data read command is received at the 1RW port by having MEA enabled and WEA disabled and receiving the read address and bank number in ADRA.

Per step 604, it is determined that the data read is to a bank that has a conflicting data read from the 1R port of the bank group. In the exemplary circuits described above, Port B is the 1R port of the bank group, and a data read command is received at the 1R port by having MEB enabled and receiving the read address and bank number in ADRB. Examples of conflicting data reads from the 1RW and 1R ports are discussed above in relation to the timing diagram of FIG. 3. Note that, if there is no conflict at the bank, then the data read may proceed directly, without reconstruction, as discussed above in relation to the timing diagram of FIG. 3.

Per step 606, in order to fulfill the data read from the 1RW port, data is read from the same address in all the other banks in the bank group. All the other banks include all the non-conflicting data banks and the parity bank. For example, if N=5, such that the bank numbers go from 0 to 4, and the conflicted bank number is 3, then data is read from the same address in banks 0, 1, 2 and 4, where bank 4 may be the parity bank.

Per step 608, the data to fulfill the data read from the 1RW port is reconstructed. Consider the example where N=5, the conflicted bank number is 3, and where the parity bank (bank 4) holds even parity bits. In this example, if corresponding bits in banks 0, 1, 2 and 4 add up to an odd number, then the corresponding bit in bank 3 may be reconstructed as a logical 1. On the other hand, if the corresponding bits in banks 0, 1, 2 and 4 add up to an even number, then the corresponding bit in bank 3 may be reconstructed as a logical 0. In this way, the data to fulfill the data read from the 1RW port may be reconstructed bit by bit.

Per step 610, the reconstructed data is output via the 1RW port of the bank group. In the exemplary circuits described above, Port A is the 1RW port of the bank group, and the reconstructed data is output from the 1RW port in the data QA.

Figure 7:
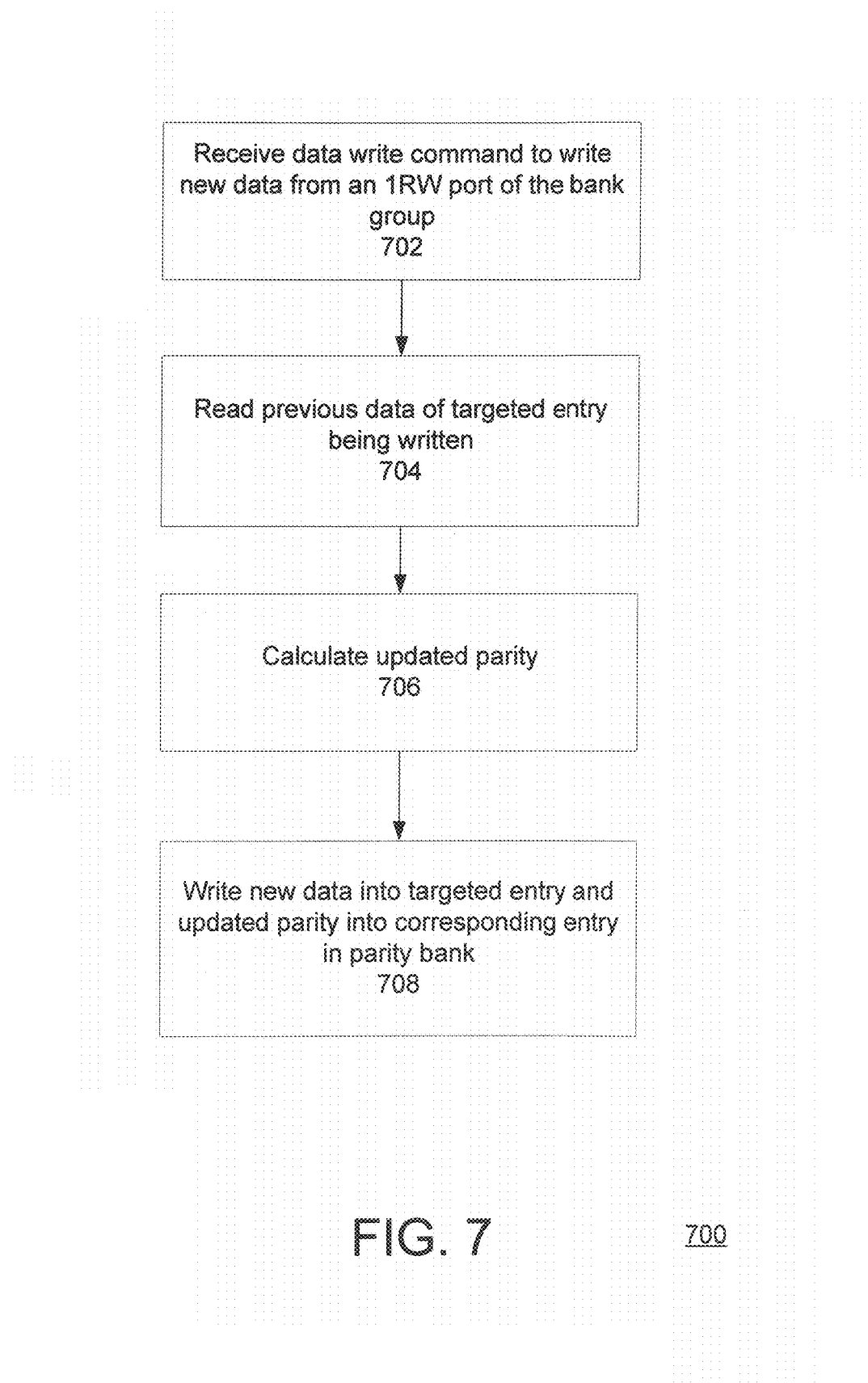
FIG. 7 is a flow chart of a method for a data write to an entry in a bank from the emulated 1RW port in accordance with an embodiment of the invention.

FIG. 7 is a flow chart of a method 700 for a data write to an entry in a bank from the emulated 1RW port of a bank group in accordance with an embodiment of the invention. The method 700 may be implemented using the exemplary circuits described above in relation to FIGS. 1-5.

Per step 702, a data write command is received from the 1RW port of the bank group. In the exemplary circuits described above, Port A is the 1RW port of the bank group, and the data write command is received at the 1RW port by having MEA and WEA both enabled and receiving the write address and bank number in ADRA.

Per step 704, the previous data stored at the targeted entry being written (i.e. the data at the write address and bank number received in ADRA) is read. As discussed above in relation to the timing diagram of FIG. 3, the previous data may be read directly if there is no read bank conflict, or the previous data may be reconstructed if there is a read bank conflict.

Per step 706, the updated parity data (for the write address in the parity bank) is calculated. As indicated in the timing diagram of FIG. 3, the updated parity data is output to the $DA_{N-1}$ data signal.

Per step 708, the new data is written into the targeted entry, and the updated parity data is written into the parity bank. As indicated in the timing diagram of FIG. 3, the $DA_{RAW}$ data signal provides the new data that is written into the bank indicated by MEA[N-2:0]. As further indicated in the timing diagram of FIG. 3, the $DA_{N-1}$ signal provides the updated parity data that is written into bank N-1 at the address indicated by $ADRA_{WRITE}$.

Note that the write sequence described above in relation to FIG. 7 is a type of read-modify-write (RMW) sequence. The "modification" step of the RMW sequence is the operation of calculating the new parity value to be written into the parity bank.

Figure 8:
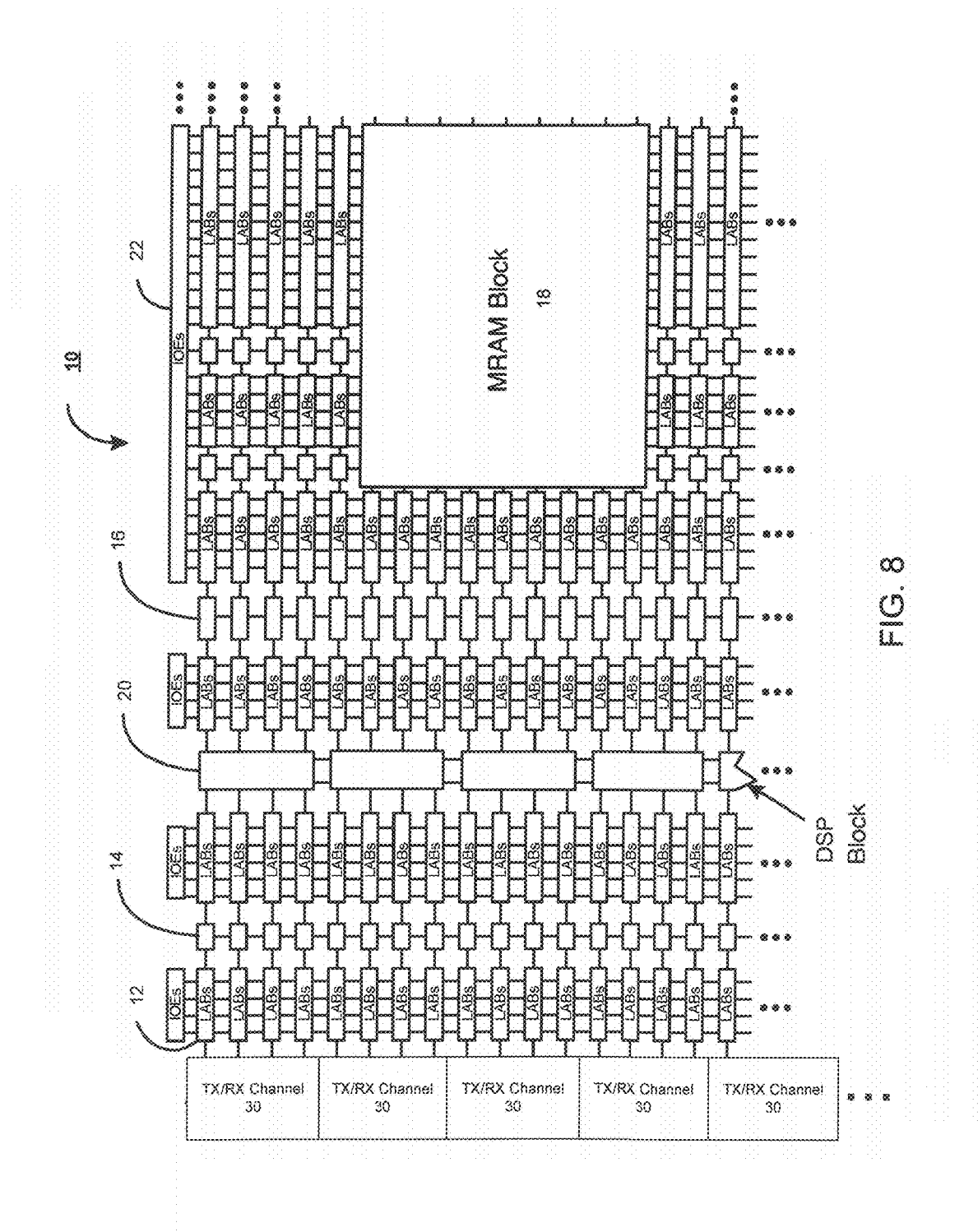
FIG. 8 is a simplified partial block diagram of a field programmable gate array (FPGA) that can include aspects of the present invention.

FIG. 8 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs.

It is to be understood that FPGA 10 is described herein for illustrative purposes only and that the present invention can be implemented in many different types of PLDs, FPGAs, and ASICs.

Figure 9:
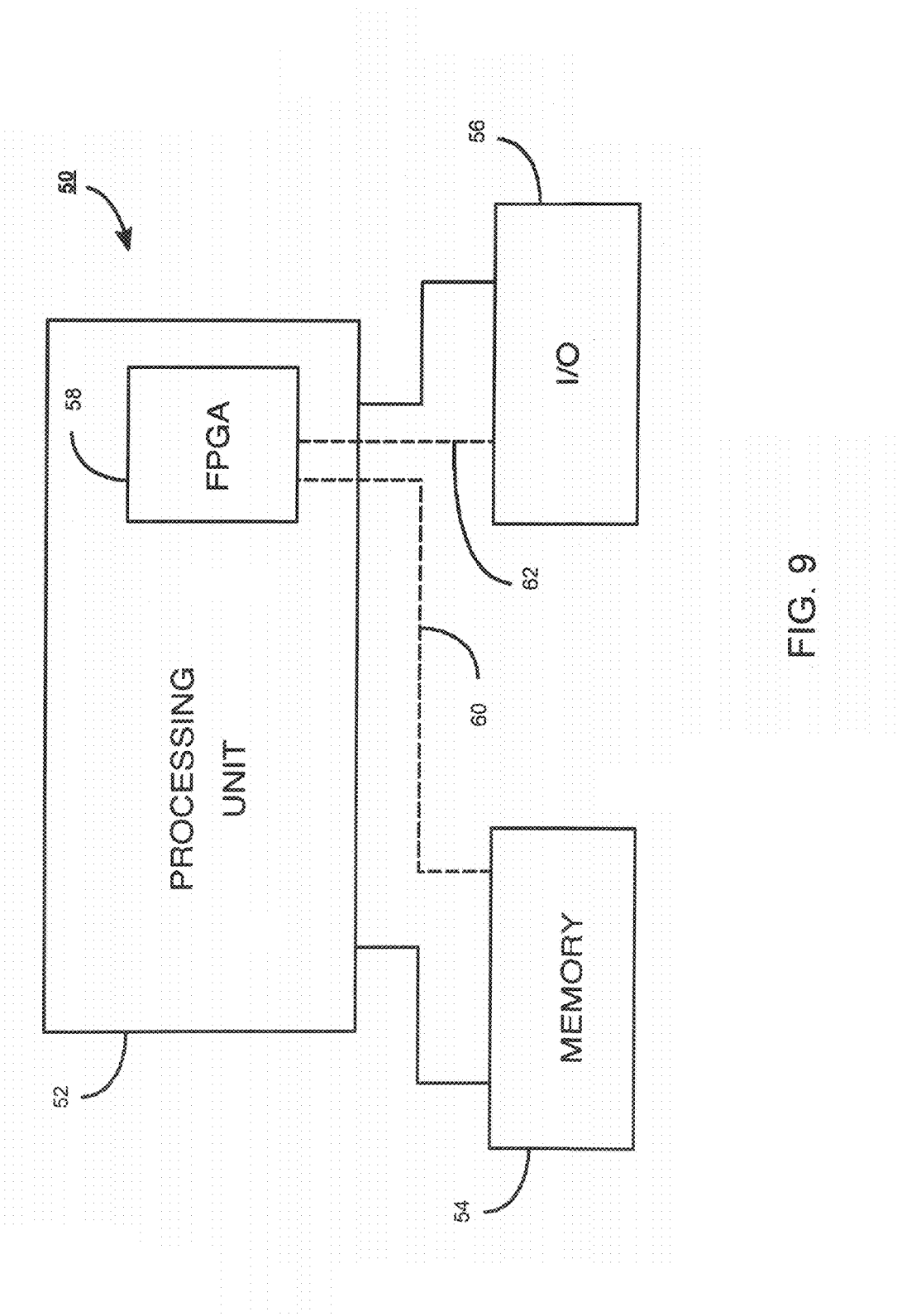
FIG. 9 is a block diagram of an exemplary digital system that can employ techniques of the present invention.

FIG. 9 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

CONCLUSION

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A memory structure comprising:
   a bank group comprising a plurality of memory banks, each memory bank having one read port and one write port; and
   a port emulation circuit module that provides a group read/write port and a group read port for the bank group wherein the port emulation control circuit includes a command decode path circuit,
   wherein the port emulation circuit module reconstructs data requested by a data read command received from the group read/write port when there is a bank conflict with a data read command received from the group read port.

2. The memory structure of claim 1, wherein the port emulation circuit module comprises:
   a port emulation control circuit that receives control signals including a first address for the group read/write port and a second address for the group read port.

3. The memory structure of claim 1, wherein the port emulation control circuit includes a command decode path circuit.

4. The memory structure of claim 3, wherein the port emulation circuit module further comprises:
   a first data path circuit for the group read/write port, wherein the first data path circuit receives write data and outputs first read data; and
   a second data path circuit for the group read port, wherein the second data path circuit outputs second read data.

5. The memory structure of claim 4, wherein the first data path circuit includes circuitry for atomic operations.

6. The memory structure of claim 5, wherein the circuitry for atomic operations includes binary adder logic, Boolean operation logic, compare logic, and data swap logic.

7. The memory structure of claim 1, wherein the data requested by the data read command received from the group read/write port is reconstructed by reading data from a same address in all other memory banks in the bank group.

8. The memory structure of claim 1, wherein, after receiving a data write command from the group read/write port to write new data to a targeted entry, the port emulation circuit module reads previous data of the targeted entry.

9. The memory structure of claim 8, wherein, after receiving the data write command from the group read/write port to write the new data to the targeted entry, the port emulation circuit module also calculates an updated parity and writes the updated parity into a corresponding entry in a parity bank of the bank group.

10. A port emulation circuit module, the circuit module comprising:

a port emulation control circuit that receives control signals including a first address for a group read/write port and a second address for a group read port;

a first data path circuit for the group read/write port, wherein the first data path circuit receives write data and outputs first read data; and a second data path circuit for the group read port, wherein the second data path circuit outputs a second read data, wherein the port emulation circuit module reconstructs data requested by a data read command received from the group read/write port when there is a bank conflict with a data read command received from the group read port.

11. The circuit module of claim 10, wherein the port emulation control circuit includes a command decode path circuit.

12. The circuit module of claim 10, wherein the first data path circuit includes circuitry for atomic operations.

13. The circuit module of claim 12, wherein the circuitry for atomic operations includes binary adder logic, Boolean operation logic, compare logic, and data swap logic.

14. The circuit module of claim 10, wherein the data requested by the data read command received from the group read/write port is reconstructed by reading data from a same address in all other memory banks in the bank group.

15. The circuit module of claim 10, wherein, after receiving a data write command from the group read/write port to write new data to a targeted entry, the port emulation circuit module reads previous data of the targeted entry.

16. The circuit module of claim 15, wherein, after receiving the data write command from the group read/write port to write the new data to the targeted entry, the port emulation circuit module also calculates an updated parity and writes the updated parity into a corresponding entry in a parity bank of the bank group.

17. A port emulation circuit module, the circuit module comprising:

a port emulation control circuit that receives control signals including a first address for a group read/write port and a second address for a group read port;

a first data path circuit for the group read/write port, wherein the first data path circuit receives write data and outputs first read data; and a second data path circuit for the group read port, wherein the second data path circuit outputs a second read data, wherein the first data path circuit includes circuitry for atomic operations, and wherein the circuitry for atomic operations includes binary adder logic, Boolean operation logic, compare logic, and data swap logic.

18. A port emulation circuit module, the circuit module comprising:

a port emulation control circuit that receives control signals including a first address for a group read/write port and a second address for a group read port;

a first data path circuit for the group read/write port, wherein the first data path circuit receives write data and outputs first read data; and a second data path circuit for the group read port, wherein the second data path circuit outputs a second read data, wherein, after receiving a data write command from the group read/write port to write new data to a targeted entry, the port emulation circuit module reads previous data of the targeted entry.

19. The circuit module of claim 18, wherein, after receiving the data write command from the group read/write port to write the new data to the targeted entry, the port emulation circuit module also calculates an updated parity and writes the updated parity into a corresponding entry in a parity bank of the bank group.

* * * * *